(12) United States Patent
Oh et al.

(10) Patent No.: US 11,437,183 B2
(45) Date of Patent: Sep. 6, 2022

(54) COIL COMPONENT

(71) Applicant: SAMSUNG ELECTRO-MECHANICS CO., LTD., Suwon-si (KR)

(72) Inventors: Seung Hee Oh, Suwon-si (KR); Tae Jun Choi, Suwon-si (KR); Tai Yon Cho, Suwon-si (KR); Byeong Cheol Moon, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 765 days.

(21) Appl. No.: 16/182,764

(22) Filed: Nov. 7, 2018

(65) Prior Publication Data
US 2019/0304664 A1 Oct. 3, 2019

(30) Foreign Application Priority Data

Apr. 2, 2018 (KR) ........................ 10-2018-0038077

(51) Int. Cl.
| | |
|---|---|
| *H01F 27/29* | (2006.01) |
| *H01F 17/00* | (2006.01) |
| *H01F 41/04* | (2006.01) |
| *H05K 1/18* | (2006.01) |

(Continued)

(52) U.S. Cl.
CPC ....... *H01F 27/292* (2013.01); *H01F 17/0013* (2013.01); *H01F 17/0033* (2013.01); *H01F 27/2804* (2013.01); *H01F 27/361* (2020.08); *H01F 27/363* (2020.08); *H01F 27/366* (2020.08); *H01F 41/041* (2013.01); *H05K 1/181* (2013.01); *H01F 2027/2809* (2013.01); *H05K 2201/1003* (2013.01)

(58) Field of Classification Search
USPC .................................. 336/199, 200, 232, 198
See application file for complete search history.

(56) References Cited

U.S. PATENT DOCUMENTS

| | | |
|---|---|---|
| 6,489,558 B1 | 12/2002 | Baba et al. |
| 2006/0022770 A1* | 2/2006 | Asakawa ............. H03H 7/1766 333/175 |

(Continued)

FOREIGN PATENT DOCUMENTS

| | | |
|---|---|---|
| JP | 59-78675 U | 5/1984 |
| JP | H02-135715 A | 5/1990 |

(Continued)

OTHER PUBLICATIONS

Office Action issued in corresponding Korean Application No. 10-2018-0038077, dated Apr. 19, 2019. 3.

(Continued)

*Primary Examiner* — Shawki S Ismail
*Assistant Examiner* — Kazi S Hossain
(74) *Attorney, Agent, or Firm* — Morgan, Lewis & Bockius LLP

(57) ABSTRACT

A coil component includes a body, a coil part including a coil pattern and embedded in the body, an external electrode disposed on an external surface of the body and electrically connected to the coil part, a shielding layer disposed on the external surface of the body, and a ceramic insulating layer disposed on a surface of the shielding layer.

18 Claims, 9 Drawing Sheets

(51) Int. Cl.
*H01F 27/28* (2006.01)
*H01F 27/36* (2006.01)

(56) References Cited

U.S. PATENT DOCUMENTS

| | | | | |
|---|---|---|---|---|
| 2007/0139976 | A1* | 6/2007 | deRochemont | H05K 1/167 |
| | | | | 363/17 |
| 2013/0069108 | A1* | 3/2013 | Lee | H01L 23/4824 |
| | | | | 257/133 |
| 2016/0141093 | A1* | 5/2016 | Jeong | H01F 17/04 |
| | | | | 336/200 |
| 2016/0268038 | A1 | 9/2016 | Choi | |
| 2017/0309394 | A1* | 10/2017 | Blow | H01F 27/36 |
| 2018/0096783 | A1* | 4/2018 | Fukuda | H01F 27/346 |
| 2018/0166211 | A1* | 6/2018 | Takatsuji | H02M 3/156 |

FOREIGN PATENT DOCUMENTS

| | | |
|---|---|---|
| JP | H10-106839 A | 4/1998 |
| JP | H11-3829 A | 1/1999 |
| JP | H11-312610 A | 11/1999 |
| JP | 2000-277334 A | 10/2000 |
| JP | 2003-197429 A | 7/2003 |
| JP | 2003-249580 A | 9/2003 |
| JP | 2005-72267 A | 3/2005 |
| JP | 2005-101417 A | 4/2005 |
| JP | 2017-17167 A | 1/2017 |
| JP | 2018-6536 A | 1/2018 |
| KR | 10-2001-0021335 A | 3/2001 |
| KR | 10-0344626 B1 | 7/2002 |
| KR | 10-2013-0046254 A | 5/2013 |
| KR | 10-2013-0115431 A | 10/2013 |
| KR | 10-2016-0108935 A | 9/2016 |
| KR | 10-2017-0006301 A | 1/2017 |
| WO | 2014/027673 A1 | 2/2014 |

OTHER PUBLICATIONS

Office Action issued in corresponding Japanese Patent Application No. 2018-210218, dated Sep. 3, 2019.
Office Action issued in corresponding Japanese Patent Application No. 2018-210218 dated Jun. 2, 2020, with English translation.
Pretrial Reexamination Report issued in corresponding Japanese Patent Application No. 2018-210218 dated Nov. 26, 2020, with English translation.

* cited by examiner

COIL COMPONENT

CROSS-REFERENCE TO RELATED APPLICATION(S)

This application claims the benefit of priority to Korean Patent Application No. 10-2018-0038077 filed on Apr. 2, 2018 in the Korean Intellectual Property Office, the disclosure of which is incorporated herein by reference in its entirety.

BACKGROUND

1. Field

The present disclosure relates to a coil component.

2. Description of Related Art

An inductor, which is a type of coil component, is a component constituting an electronic circuit together with a resistor and a capacitor, and may be used as a component for removing noise or as part of an LC resonance circuit. The inductor may be classified as one of various types of inductors, such as a multilayer type inductor, a winding type inductor, a thin film type inductor, and the like.

In accordance with the recent trend toward increased miniaturization and multifunctionalization of electronic products, improvements of high-current characteristics in addition to miniaturization have also been required in the inductor. Due to the requirement for miniaturization and multifunctionality, a used frequency of the inductor has been continuously moved to a high frequency. In a portable device such as a smartphone, in accordance with improvement in performance, an internal circuit has been complicated, and countermeasures for noise such as electromagnetic interference (EMI) generated in the circuit has become more important.

Currently, in a general EMI shielding technology, after mounting an electronic component on a board, the electronic component and the board are simultaneously enclosed by a shield can.

SUMMARY

An aspect of the present disclosure may provide a coil component capable of significantly decreasing a leakage magnetic flux by having an electromagnetic wave shielding structure that is advantageous for miniaturization and is efficient.

According to an aspect of the present disclosure, a coil component includes a body, a coil part including a coil pattern and embedded in the body, an external electrode disposed on an external surface of the body and electrically connected to the coil part, a shielding layer disposed on the external surface of the body, and a ceramic insulating layer disposed on a surface of the shielding layer.

The ceramic insulating layer may be disposed between the shielding layer and the body.

The ceramic insulating layer may be disposed on a surface of the shielding layer opposite to the body.

The ceramic insulating layer may cover an entire surface of the shielding layer.

A region of the ceramic insulating layer disposed between the shielding layer and the body and a region of the ceramic insulating layer disposed on a surface of the shielding layer opposite to the body may be formed integrally with each other.

The shielding layer may contain a metal ingredient, and the ceramic insulating layer may contain an oxide of the metal ingredient.

The ceramic insulating layer may be an anodized layer of the metal ingredient of the shielding layer.

The ceramic insulating layer may contain an oxide of a metal that is an ingredient of the shielding layer.

The coil component may further include an adhesive layer disposed between the body and the shielding layer.

The body may have first and second surfaces opposing each other in one direction, the coil pattern may format least one turn centered on the direction, and the external electrodes may be disposed at least on the first surface of the body, and the shielding layer may be disposed at least on the second surface of the body.

The shielding layer may include a cap portion disposed on the second surface of the body and side wall portions connected to the cap portion and disposed on wall surfaces of the body connecting the first and second surfaces of the body to each other.

The wall surfaces of the body may be comprised of four surfaces, and the side wall portions of the shielding layer may entirely cover the four surfaces of the body.

The wall surfaces of the body may be comprised of four surfaces, and the side wall portions of the shielding layer may cover two surfaces of the body opposing each other among the four surfaces of the body.

The cap portion and the side wall portions may be formed integrally with each other.

The shielding layer may cover only the other surface of the body.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Figure 1:
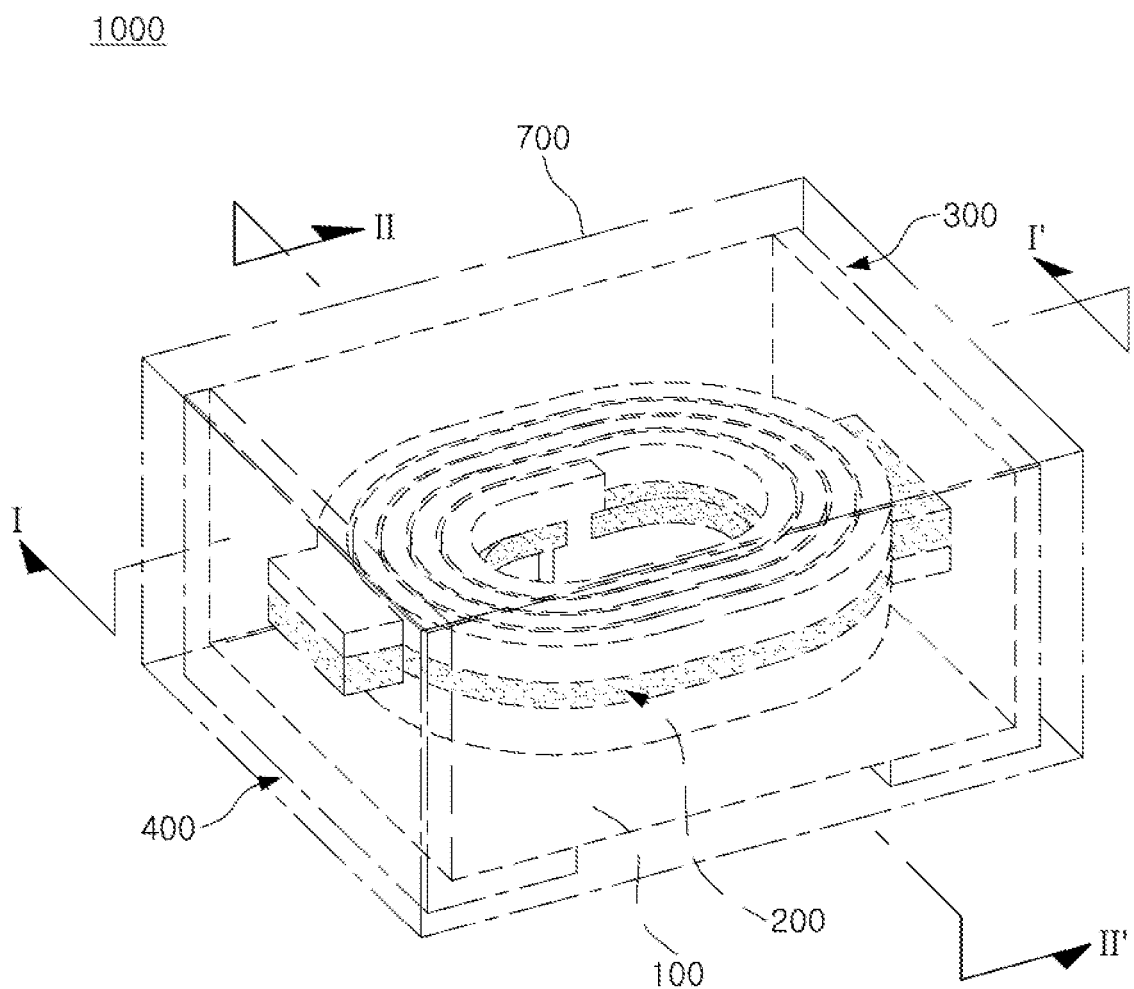
FIG. 1 is a perspective view schematically showing a coil component according to an exemplary embodiment in the present disclosure.
Figure 2A:
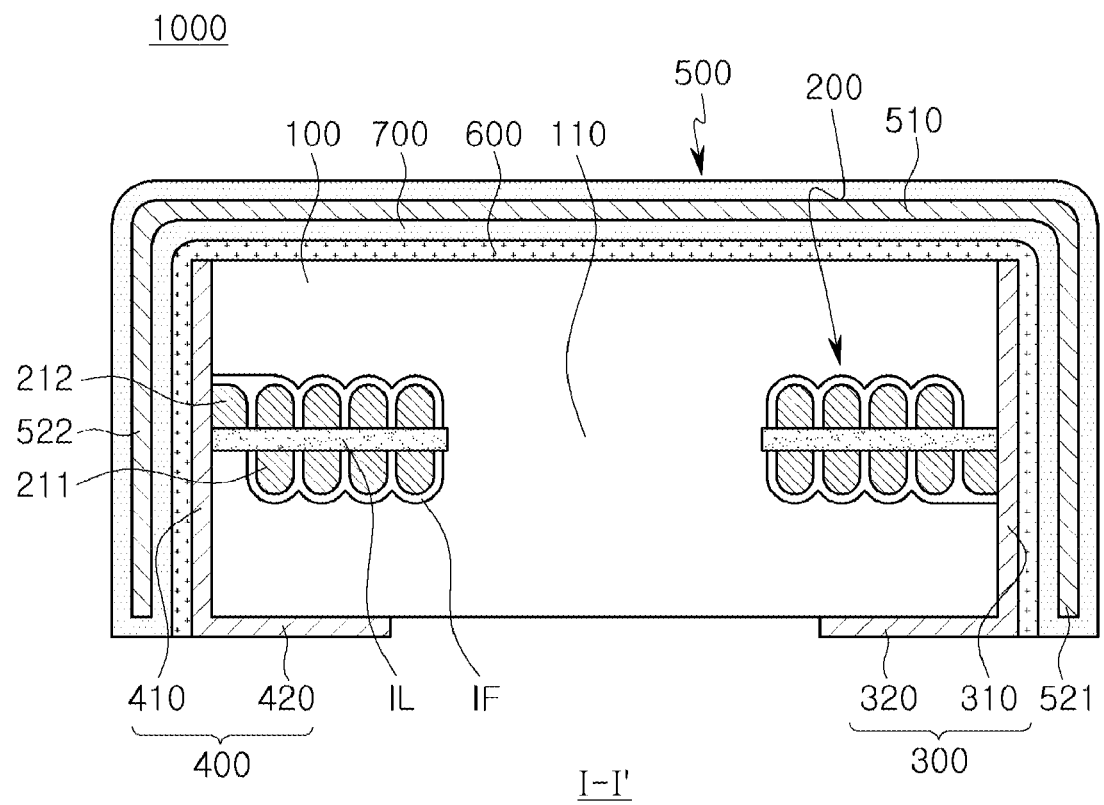
FIG. 2A is a cross-sectional view taken along line I-I' of FIG. 1.
Figure 2B:
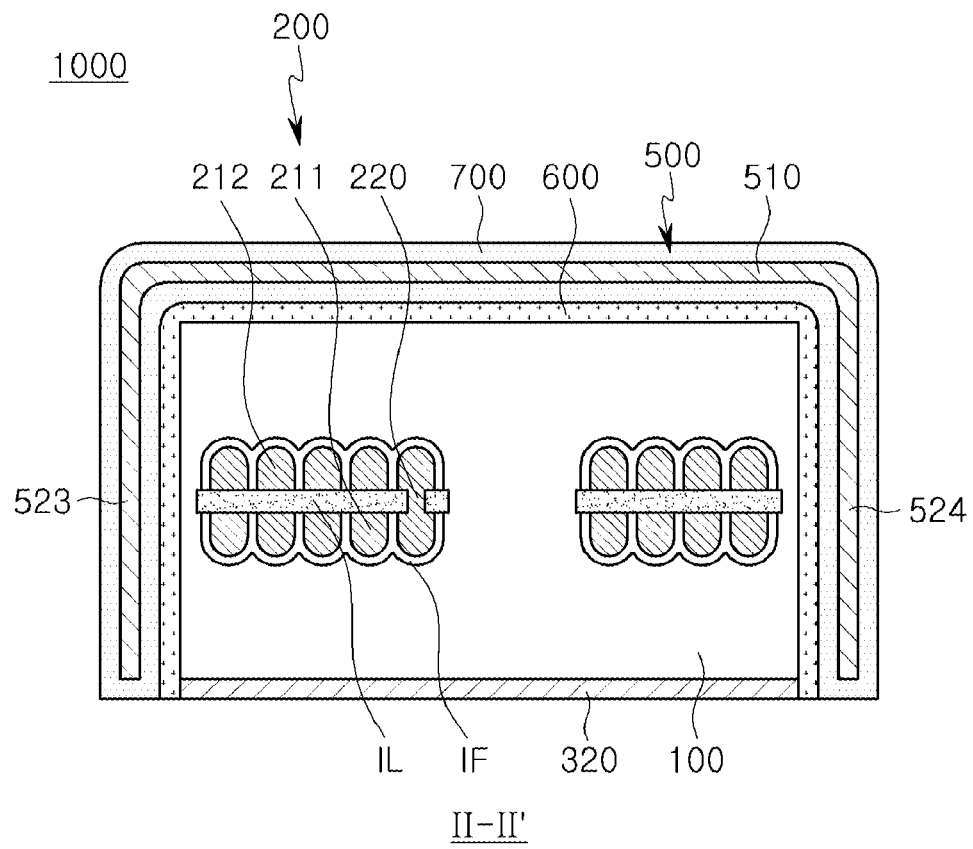
FIG. 2B is a cross-sectional view taken along line II-II' of FIG. 1.

FIG. 1 is a perspective view schematically showing a coil component according to an exemplary embodiment in the present disclosure. FIG. 2A is a cross-sectional view taken along line I-I' of FIG. 1. FIG. 2B is a cross-sectional view taken along line II-II' of FIG. 1. In addition, FIGS. 3 and are cross-sectional views illustrating coil components according to modified embodiments.

Referring to FIGS. 1, 2A and 2B, a coil component 1000 according to the exemplary embodiment in the present disclosure may include a body 100, a coil part 200, external electrodes 300 and 400, a shielding layer 500, and a ceramic insulating layer 700. In addition, the coil component 1000 may further include an adhesive layer 600, an internal insulating layer IL, and an insulating film IF.

The body 100 may include the coil part 200 embedded therein and be formed in an entirely hexahedral shape as illustrated. The body 100 may have first and second surfaces opposing each other in one direction, wherein the first surface may correspond to a lower surface of the body 100 and the second surface may correspond to an upper surface of the body 100 in the accompanying drawings. Further, wall surfaces (or side surfaces) of the body 100 may connect the first and second surfaces of the body 100 to each other. Hereinafter, as an example, the exemplary embodiment in the present disclosure will be described on the assumption that the body 100 has a hexahedral shape. However, a coil component including a body formed in a shape other than the hexahedral shape is not excluded in the scope of the present exemplary embodiment by the description.

The body 100 may contain a magnetic material and a resin. More specifically, the body 100 may be formed by stacking one or more magnetic composite sheets in which the magnetic material is dispersed in the resin. Here, the magnetic material may be ferrite or a metal magnetic powder. As an example, the ferrite may be at least one selected from spinel type ferrite such as Mg—Zn based ferrite, Mn—Zn based ferrite, Mn—Mg based ferrite, Cu—Zn based ferrite, Mg—Mn—Sr based ferrite, and Ni—Zn based ferrite; hexagonal ferrite such as Ba—Zn based ferrite, Ba—Mg based ferrite, Ba—Ni based ferrite, Ba—Co based ferrite, and Ba—Ni—Co based ferrite; garnet type ferrite such as Y based ferrite; and Li based ferrite.

The metal magnetic powder may contain one or more selected from the group consisting of iron (Fe), silicon (Si), chromium (Cr), cobalt (Co), molybdenum (Mo), aluminum (Al), and nickel (Ni). For example, the metal magnetic powder may be at least one of pure iron powder, Fe—Si based alloy powder, Fe—Si—Al based alloy powder, Fe—Ni based alloy powder, Fe—Ni—Mo based alloy powder, Fe—Ni—Mo—Cu based alloy powder, Fe—Co based alloy powder, Fe—Ni—Co based alloy powder, Fe—Cr based alloy powder, Fe—Cr—Si based alloy powder, Fe—Ni—Cr based alloy powder, and Fe—Cr—Al based alloy powder. The metal magnetic powder may be amorphous or crystalline. For example, the metal magnetic powder may be Fe—Si—B—Cr based amorphous alloy powder, but is not necessarily limited thereto. The ferrite and the metal magnetic powder may each have an average diameter of about 0.1 μm to 30 μm, but are not limited thereto.

The body 100 may contain two or more kinds of magnetic materials. Here, the phrase "different kinds of magnetic materials" means that the magnetic materials are distinguished from each other in any one of average diameter, composition, crystallinity, and shape thereof. Examples of a resin capable of being contained in the body 100 may include epoxy, polyimide, a liquid crystal polymer (LCP), and the like, but are not limited thereto.

The body 100 may include a core 110 penetrating through a coil part 200 to be described below. The core 110 may be formed by filling the magnetic composite sheet in a through hole of the coil part 200, but is not limited thereto. Further, unlike the above-described content, the body 100 may be substantially formed of only a magnetic material such as ferrite, instead of having a structure in which the magnetic material is dispersed in the resin.

The coil part 200 may be embedded in the body 100 and exhibit characteristics of the coil component. For example, when the coil component 1000 according to the present exemplary embodiment is a power inductor as described above, the coil part 200 may serve to stabilize a power source of an electronic device by storing an electric field as a magnetic field to maintain an output voltage. The coil part 200 may include a first coil pattern 211, a second coil pattern 212, and a via 220. The first and second coil patterns 211 and 212 and an internal insulating layer IL to be described below may be formed to be sequentially stacked in the thickness (T) direction of the body 100.

The first and second coil patterns 211 and 212 may each be formed in a flat spiral shape. As an example, the first coil pattern 211 may form at least one turn on one surface of the internal insulating layer IL centered on the thickness (T) direction of the body 100. The via 220 may penetrate through the internal insulating layer IL so as to electrically connect the first and second coil patterns 211 and 212 to each other, thereby coming in contact with each of the first and second coil patterns 211 and 212. As a result, the coil part 200 applied to the present exemplary embodiment may be formed as a single coil generating a magnetic field in the thickness (T) direction of the body 100. At least one of the first and second coil patterns 211 and 212 and the via 220 may include at least one conductive layer.

As an example, when the second coil pattern 212 and the via 220 are formed by plating, the second coil pattern 212 and the via 220 may each include a seed layer of an electroless plating layer and an electroplating layer. Here, the electroplating layer may have a monolayer structure or a multilayer structure. The electroplating layer having the multilayer structure may also be formed in a conformal film structure in which one electroplating layer is covered with another electroplating layer. Alternatively, the electroplating layer having the multilayer structure may also be formed so that only on one surface of one electroplating layer, another electroplating layer is stacked. The seed layer of the second coil pattern 212 and the seed layer of the via 220 may be formed integrally with each other so that a boundary therebetween is not formed, but the seed layer of the second coil pattern 212 and the seed layer of the via 220 are not limited thereto. The electroplating layer of the second coil pattern 212 and the electroplating layer of the via 220 may be formed integrally with each other so that a boundary therebetween is not formed, but the electroplating layer of the second coil pattern 212 and the electroplating layer of the via 220 are not limited thereto.

As another example, when the coil part 200 is formed by separately forming the first and second coil patterns 211 and 212 and then collectively stacking the first and second coil patterns 211 and 212 on the internal insulating layer IL, the via 220 may include a high-melting point metal layer and a low-melting point metal layer having a melting point lower than that of the high-melting point metal layer. Here, the low-melting point metal layer may be formed of solder containing lead (Pb) and/or tin (Sn). The low-melting point metal layer may be at least partially melted by a pressure and a temperature at the time of collective stacking, such that an inter-metallic compound (IMC) layer may be formed in a boundary between the low-melting point metal layer and the second coil pattern 212.

As an example, the first and second coil patterns 211 and 212 may be formed to protrude on lower and upper surfaces of the internal insulating layer (IL), respectively. As another example, the first coil pattern 211 may be embedded in the lower surface of the internal insulating layer IL so that a lower surface thereof is exposed to the lower surface of the internal insulating layer IL, and the second coil pattern 212 may be formed to protrude on the upper surface of the internal insulating layer IL. In this case, a concave portion may be formed in the lower surface of the first coil pattern 211, such that the lower surface of the internal insulating layer IL and the lower surface of the first coil pattern 211 may not be positioned on the same plane. As another example, the first coil pattern 211 may be embedded in the lower surface of the internal insulating layer IL so that the lower surface thereof is exposed to the lower surface of the internal insulating layer IL, and the second coil pattern 212 may be embedded in the upper surface of the internal insulating layer IL so that the upper surface thereof is exposed to the upper surface of the internal insulating layer IL.

End portions of the first and second coil patterns 211 and 212 may be exposed to the wall surfaces (or side surfaces) of the body 100, respectively. The end portion of the first coil pattern 211 exposed to the wall surface of the body 100 may be connected to the first external electrode 300. Similarly, the end portion of the second coil pattern 212 exposed to the side surface of the body 100 may be connected to the second external electrode 400. The first and second coil patterns 211 and 212 and the via 220 may each be formed of a conductive material such as copper (Cu), aluminum (Al), silver (Ag), tin (Sn), gold (Au), nickel (Ni), lead (Pb), titanium (Ti), or alloys thereof, but are not limited thereto.

The internal insulating layer IL may be formed of an insulating material including at least one of thermosetting insulating resins such as an epoxy resin, thermoplastic insulating resins such as polyimide, and photosensitive insulating resins, or an insulating material in which a reinforcing material such as glass fiber or an inorganic filler is impregnated in this insulating resin. As an example, the internal insulating layer IL may be formed of an insulating material such as prepreg, an Ajinomoto build-up film (ABF), FR-4, a bismaleimide triazine resin, a photoimageable dielectric (PID), or the like, but is not limited thereto. As the inorganic filler, at least one selected from the group consisting of silica ($SiO_2$), alumina ($Al_2O_3$), silicon carbide (SiC), barium sulfate ($BaSO_4$), talc, mud, mica powder, aluminum hydroxide ($AlOH_3$), magnesium hydroxide ($Mg(OH)_2$), calcium carbonate ($CaCO_3$), magnesium carbonate ($MgCO_3$), magnesium oxide (MgO), boron nitride (BN), aluminum borate ($AlBO_3$), barium titanate ($BaTiO_3$), and calcium zirconate ($CaZrO_3$) may be used. When the internal insulating layer IL is formed of an insulating material containing a reinforcing material, the internal insulating layer IL may provide more excellent rigidity. When the internal insulating layer IL is formed of an insulating material that does not contain glass fiber, the internal insulating layer IL is advantageous for thinning a thickness of the entire coil portion 200. When the internal insulating layer IL is formed of an insulating material containing a photosensitive insulating resin, the number of processes may be decreased, which is advantageous for decreasing a manufacturing cost, and a fine hole may be formed.

The insulating film IF may be formed along surfaces of the first coil pattern 211, the internal insulating layer IL, and the second coil pattern 212. The insulating film IF may be formed in order to protect and insulate the respective coil patterns 211 and 212 and contain an insulating material known in the art such as parylene, or the like. Any insulating material may be contained in the insulating film IF without particular limitation. The insulating film IF may be formed by a method such as a vapor deposition method, but is not limited thereto. The insulating film IF may be formed by stacking an insulation film on both surfaces of the internal insulating layer IL on which the first and second coil patterns 211 and 212 are formed.

Meanwhile, although not illustrated, at least one of the first and second coil patterns 211 and 212 may be formed in plural. As an example, the coil part 200 may have a structure in which a plurality of first coil patterns 211 are formed, and another first coil pattern is stacked on a lower surface of one first coil pattern. In this case, an additional insulating layer may be disposed between the plurality of first coil patterns 211.

The external electrodes 300 and 400 may be disposed on one surface of the body 100 and electrically connected to the coil patterns 211 and 212. The external electrodes 300 and 400 may include a first external electrode 300 electrically connected to the first coil pattern 211 and a second external electrode 400 electrically connected to the second coil pattern 212. More specifically, the first external electrode 300 may include a first connection portion 310 disposed on the wall surface of the body 100 and connected to the end portion of the first coil pattern 211 and a first extension portion 320 extended from the first connection portion 310 to one surface of the body 100 (the lower surface of the body 100 in the accompanying drawings). The second external electrode 400 may include a second connection portion 410 disposed on the wall surface of the body 100 and connected to the end portion of the second coil pattern 212 and a second extension portion 420 extended from the second connection portion 410 to one surface of the body 100. The first extension portion 310 and the second extension portion 410 may be spaced apart from each other so that the first and second external electrodes 300 and 400 do not come in contact with each other.

The external electrodes 300 and 400 may electrically connect the coil component 1000 to a printed circuit board, or the like, when the coil component 1000 according to the present exemplary embodiment is mounted on the printed circuit board, or the like. As an example, the coil component 1000 according to the present exemplary embodiment may be mounted on the printed circuit board so that one surface (the lower surface) of the body 100 faces an upper surface of the printed circuit board, and the extension portions 320 and 420 of the external electrodes 300 and 400 disposed on one surface of the body 100 and a connection portion of the printed circuit board may be electrically connected to each other.

The external electrodes 300 and 400 may include, for example, conductive resin layers and conductive layers formed on the conductive resin layers, respectively. The conductive resin layer may be formed by printing a paste, or the like, and may contain one or more conductive metals selected from the group consisting of copper (Cu), nickel (Ni), and silver (Ag), and a thermosetting resin. The conductive layer may contain one or more selected from the group consisting of nickel (Ni), copper (Cu), and tin (Sn), and be formed, for example, by plating.

Meanwhile, in the present exemplary embodiment, the external electrodes 300 and 400 may each be formed in an 'L' shape on the side surface and lower surface of the body 100, but if necessary, the shapes of the external electrodes 300 and 400 may be changed. In other words, the external electrodes 300 and 400 may also be formed on the upper surface or the entire side surfaces of the body 100. On the contrary, the external electrodes 300 and 400 may also be formed only on the lower surface of the body 100.

The shielding layer 500 may be disposed on an external surface of the body 100 and decrease radiated noise leaked from the coil component 1000 to the outside. In the present exemplary embodiment, the shielding layer 500 may include a cap portion 510 disposed on the second surface (the upper surface in the accompanying drawing) of the body 100 opposing the first surface of the body 100 and side wall portions 521 to 524 connected to the cap portion 510 and disposed on the wall surfaces of the body connecting the first and second surfaces of the body 100 to each other. In other words, the side wall portions 521 to 524 may be disposed on the wall surfaces of the body 100 comprised of 4 surfaces, such that the shielding layer 500 may be disposed on a total of 5 surfaces, that is, all the surfaces of the body 100 except for the lower surface (the first surface) of the body 100 corresponding to a mounting surface of the coil component 1000. Therefore, electromagnetic waves generated in the coil component 1000 may be effectively shielded.

First to fourth side wall portions 521 to 524 may be formed integrally with each other. That is, the first to fourth side wall portions 521 to 524 may be formed by the same process, such that there is no boundary therebetween. Further, the cap portion 510 and the side wall portion 520 may be formed integrally with each other. That is, the cap portion 510 and the side wall portion 520 may be formed by the same process, such that there is no boundary therebetween.

The shielding layer 500 may contain at least one of conductive substances and magnetic substances. As an example, the conductive substance may be a metal or alloy including one or more selected from the group consisting of copper (Cu), aluminum (Al), iron (Fe), silicon (Si), boron (B), chromium (Cr), niobium (Nb), and nickel (Ni), and may be Fe—Si or Fe—Ni. Further, the shielding layer 500 may contain one or more selected from the group consisting of ferrite, permalloy, and an amorphous ribbon. The shielding layer 500 may have a double layer structure including a layer containing the conductive substance and a layer containing the magnetic substance, or may also have a single layer structure containing the conductive substance and/or the magnetic substance. A thickness of the shielding layer may be determined in consideration of a size and shielding performance of the coil component 1000, and the shielding layer 500 may have a thickness of 1 to 200 um.

The ceramic insulating layer 700 may be disposed on a surface of the shielding layer 500 to electrically insulate the shielding layer 500, and protect the shielding layer from external influences. The ceramic insulating layer 700 may be disposed between the shielding layer 500 and the body 100 to electrically insulate the shielding layer 500 from the body 100 and the external electrodes 300 and 400. The ceramic insulating layer 700 may be implemented using a material containing a metal oxide (for example, aluminum oxide), a metal nitride (for example, aluminum nitride), a metal carbide, or the like. This will be described below.

Figure 3:
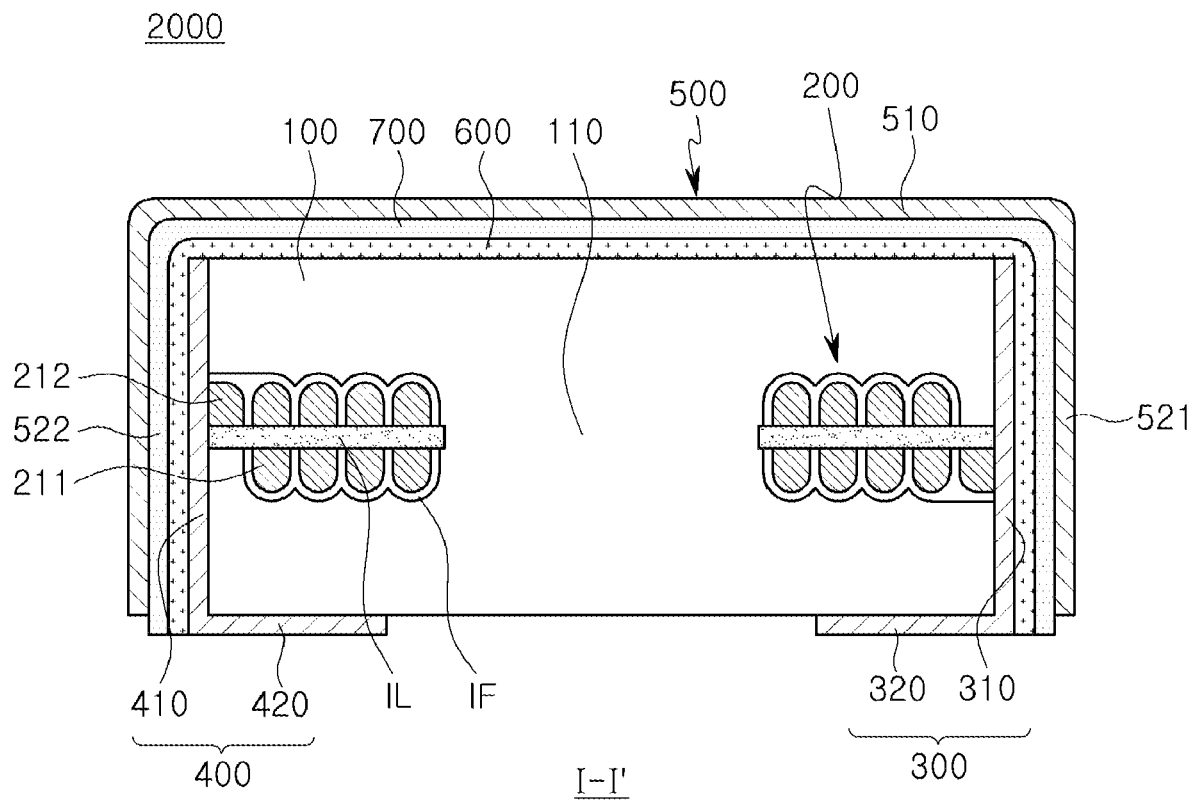
FIGS. 3 and 4 are cross-sectional views illustrating coil components according to modified embodiments.
Figure 4:
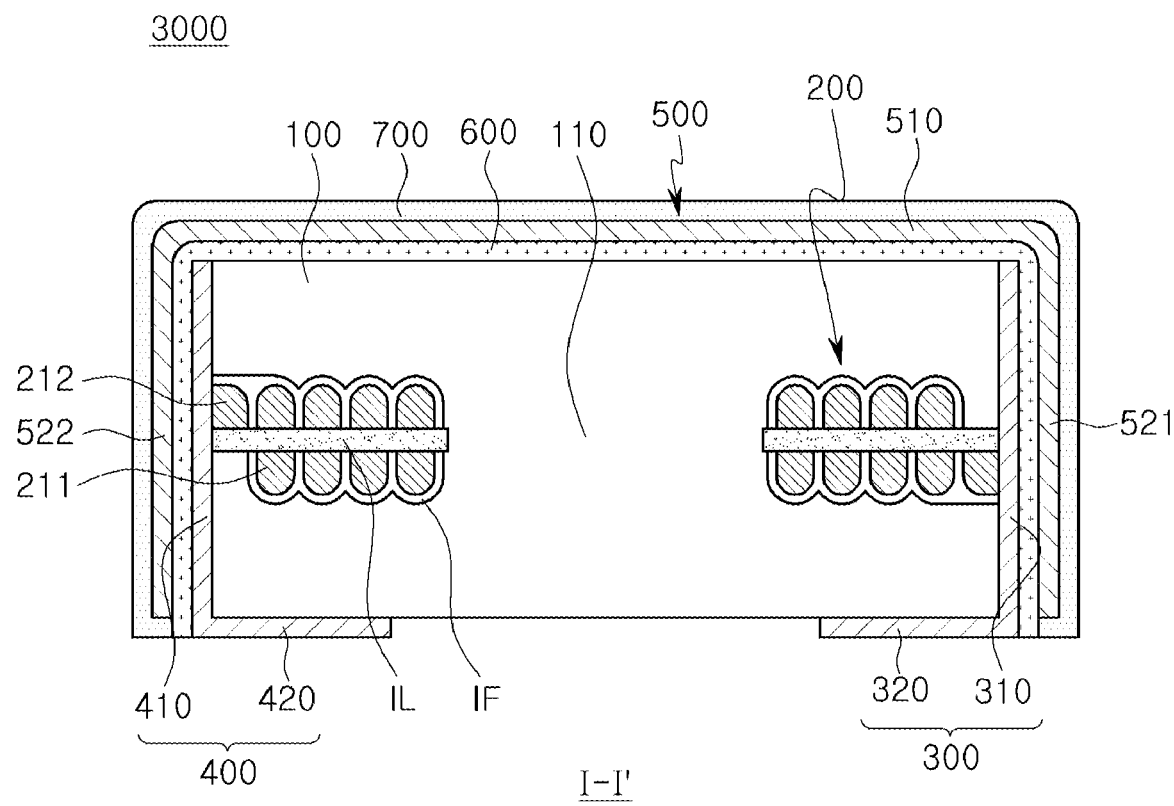
Figure 5:
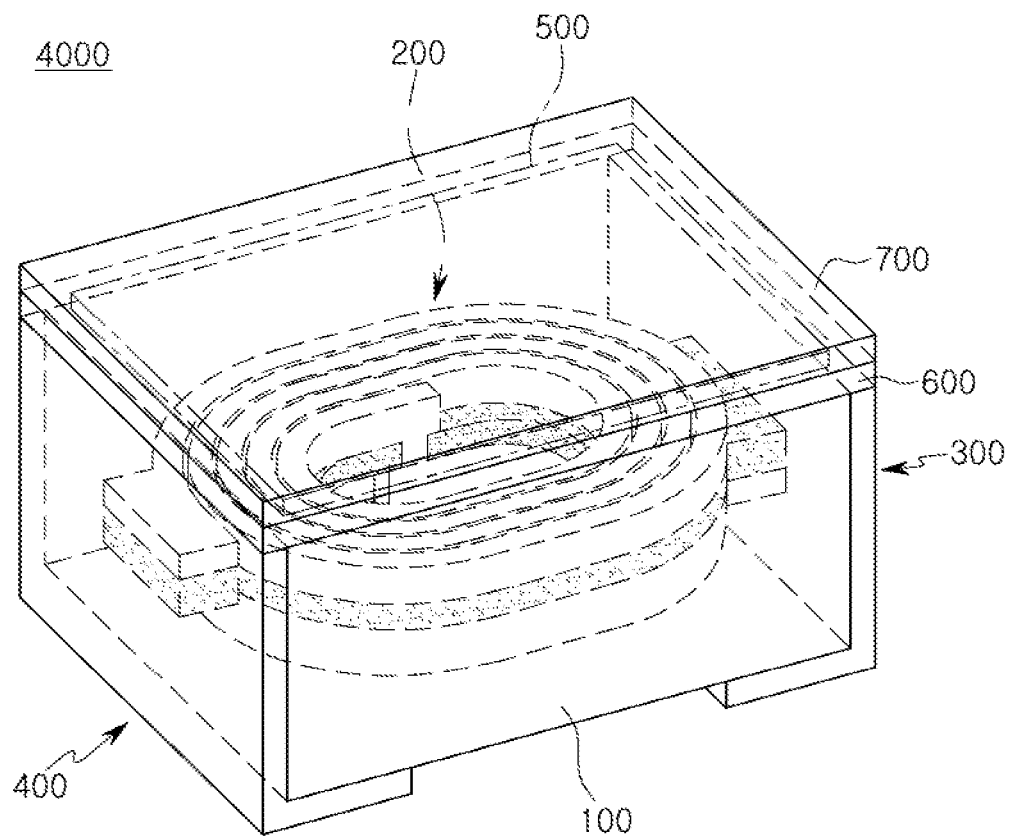
FIGS. 5 through 8 are perspective views illustrating coil components according to other modified embodiments.
Figure 6:
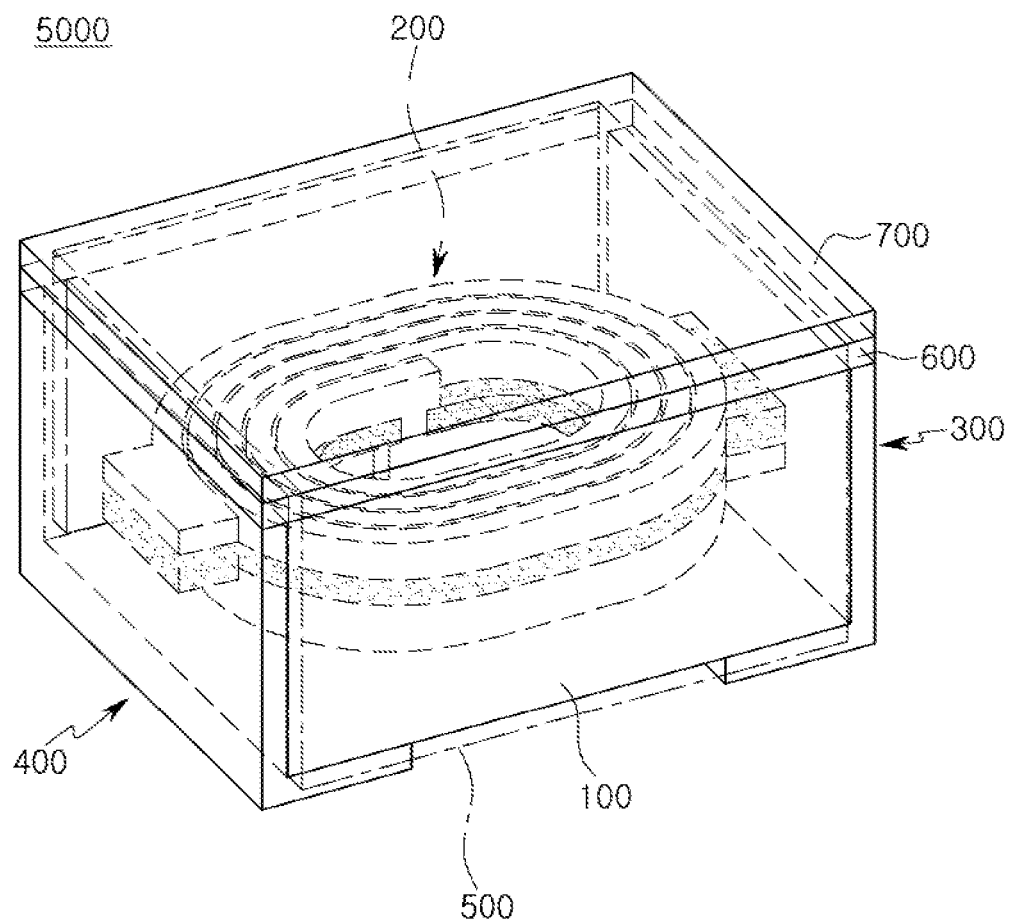

In a coil component 2000 according to the modified embodiment of FIG. 3, a ceramic insulating layer 700 may be formed only between the shielding layer 500 and the body 100. The ceramic insulating layer 700 may be disposed on a surface of the shielding layer 500 opposite to the body 100 in order to more surely protect the shielding layer 500 from external influences, and in a coil component 3000 according to the modified embodiment of FIG. 4, a ceramic insulating layer 700 may be formed only on a surface of the shielding layer 500 opposite to the body 100.

Further, as illustrated in FIGS. 2A and 2B, the ceramic insulating layer 700 may cover the entire surface of the shielding layer 500. In this case, the ceramic insulating layer 700 may be formed in an integrated structure. In other words, a region of the ceramic insulating layer 700 disposed between the shielding layer 500 and the body 100 and a region of the ceramic insulating layer 700 disposed on the surface of the shielding layer 500 opposite to the body 100 may be formed integrally with each other, such that air tightness of the ceramic insulating layer 700 may be improved. The integrated structure of the ceramic insulating layer 700 as described above may be effectively implemented by a method of allowing a ceramic layer to grow on the surface of the shielding layer, a method of anodizing the shielding layer 500, or the like.

The ceramic insulating layer 700 may have excellent insulation performance, be implemented at a thin thickness as compared to an insulating layer formed of a polymer, or the like, and have excellent mechanical strength. Further, since the ceramic insulating layer 700 may be formed on the surface of the shielding layer by a deposition method such as a liquid phase deposition method or a vapor phase deposition method, or an anodizing method, the ceramic insulating layer 700 may be applied to shielding layers 500 having various shapes. A thickness of the ceramic insulating layer 700 may be determined in consideration of a size, a breakdown voltage, or the like, of the coil component 1000. For example, the ceramic insulating layer 700 may have a thickness of 0.1 to 40 um.

Meanwhile, as described above, the shielding layer 500 may contain a metal ingredient, and the ceramic insulating layer 700 may contain an oxide of a metal ingredient. More specifically, the ceramic insulating layer 700 may be an anodized layer of the metal ingredient of the shielding layer, such that an insulating structure having a thin thickness and excellent insulating characteristics may be effectively obtained. For example, the shielding layer 500 may be in a form of metal foil containing Al, Cu, Ni, or the like, and the ceramic insulating layer 700 may contain oxides of these metals.

However, the ceramic insulating layer 700 may also be formed by another method other than the anodizing method. In this case, the ceramic insulating layer 700 may contain an oxide of a metal that is not an ingredient of the shielding layer 500.

The adhesive layer 600 may be disposed between the body 100 and the shielding layer 500, and provide a stable binding structure. As an example of a material for having an adhesive function, the adhesive resin 600 may contain a thermoplastic resin such as a polystyrene based thermoplastic resin, a vinyl acetate based thermoplastic resin, a polyester based thermoplastic resin, a polyethylene based thermoplastic resin, a polypropylene based thermoplastic resin, a polyamide based thermoplastic resin, a rubber based thermoplastic resin, an acrylic thermoplastic resin, and the like, or a thermosetting resin such as a phenolic thermosetting resin, an epoxy based thermosetting resin, a urethane based thermosetting resin, a melamine based thermosetting resin, an alkyd based thermosetting resin. However, in order to bind the shielding layer and the body 100 to each other, the adhesive layer 600 is not necessarily required, and the adhesive layer 600 may be excluded according to exemplary embodiments. In this case, the ceramic insulating layer 700 may come in direct contact with the body.

FIGS. 5 through 8 are perspective views illustrating coil components according to other modified embodiments. First, in a coil component 4000 according to the modified embodiment of FIG. 5, a shielding layer 500 may cover only the other surface of a body 100, that is, an upper surface of the body 100. Considering a turn direction of a coil pattern, a region in which a leakage magnetic flux may be most frequently generated may correspond to the upper surface of the body 100. Considering this, a shielding structure having a compact shape while significantly decreasing deterioration of shielding performance may be implemented by disposing the shielding layer 500 to cover only the upper surface of the body 100. A region covered by the shielding layer 500 may be changed in other forms. A coil component 5000 according to the modified embodiment of FIG. 6 may have a three-surface shielding structure and a shielding layer 500, more specifically, side wall portions of the shielding layer 500 may cover two surfaces of a body 100 opposing each other among four wall surfaces of the body 100. Due to the three-surface shielding structure as described above, a possibility of a short-circuit with external electrodes 300 and 400 may be decreased, and shielding performance may be maintained.

Figure 7:
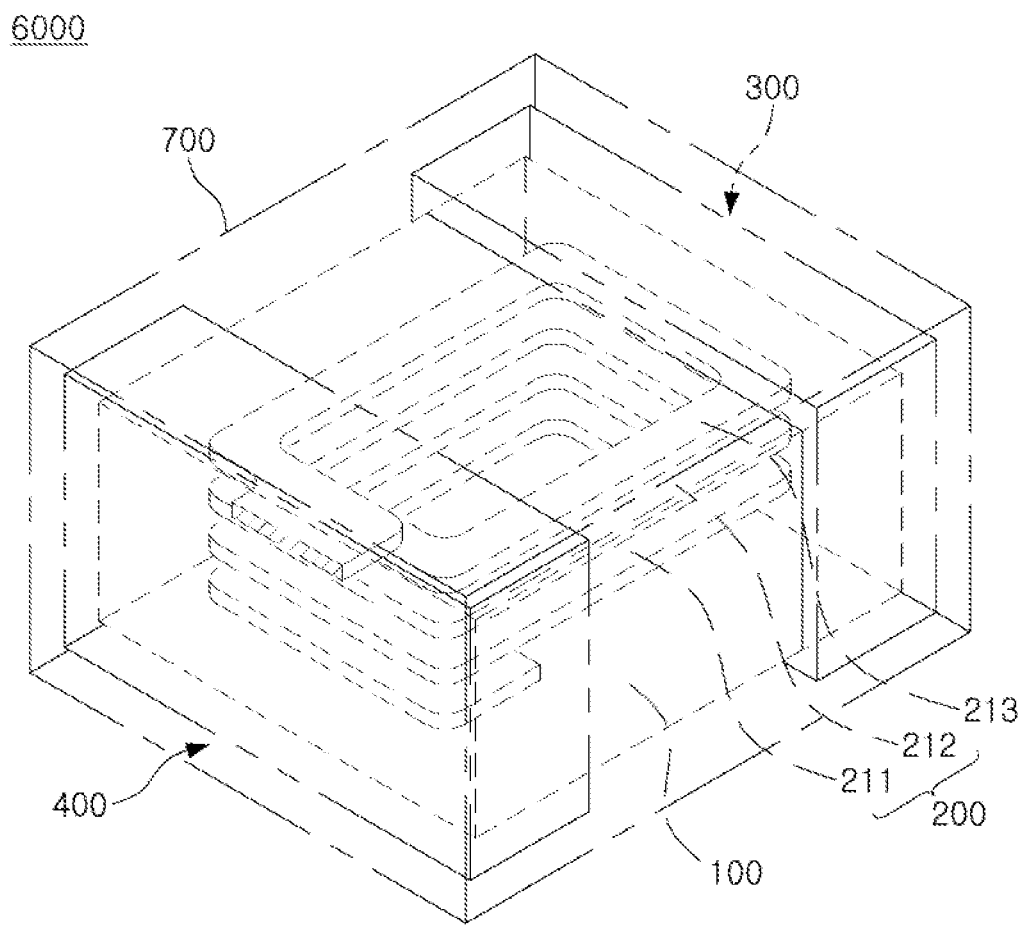
Figure 8:
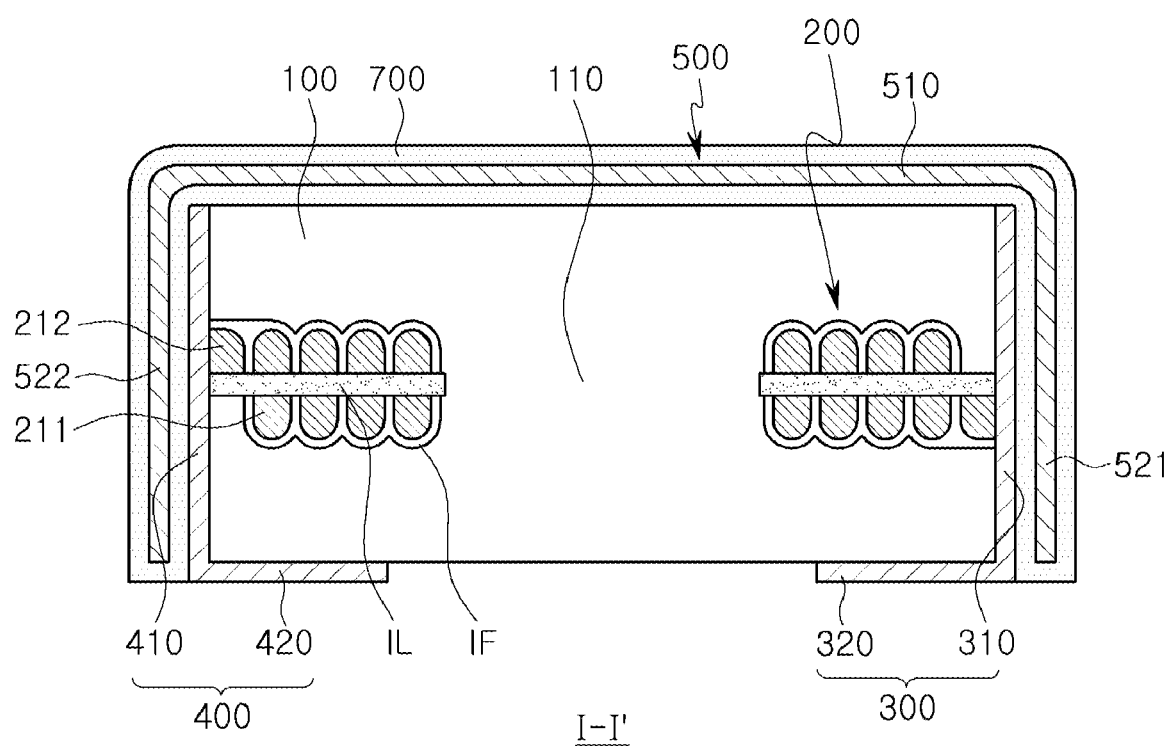

Next, in a coil component 6000 according to the modified embodiment of FIG. 7, shapes of coil patterns 211, 212, and 213 and external electrodes 300 and 400 may be changed as compared to the above-mentioned exemplary embodiments. An overlapping description of the other components will be omitted. Referring to FIG. 7, a coil part 200 may have a structure in which a plurality of coil patterns 211 to 213 are stacked in a thickness direction of a body 100, and the plurality of coil patterns 211 to 213 may be connected to each other by a conductive via to constitute the coil part 200. Further, unlike the above-mentioned exemplary embodiments, external electrodes 300 and 400 may be formed on upper and lower surfaces and side surfaces of the body 100 to have a "⊏" shape.

In the present modified embodiment, the body 100 may be formed by applying a conductive paste for forming the coil part 200 on a magnetic sheet and stacking the magnetic sheets. Here, a via hole for forming a conductive via may be processed in at least portions of the magnetic sheets constituting the body 100. The via hole may be applied with the conductive paste similarly to the coil part, such that the conductive via may be formed.

As set forth above, according to exemplary embodiments in the present disclosure, in the coil component, the electromagnetic wave shielding layer includes a thin film type ceramic insulating layer, such that the coil component may be advantageous for miniaturization and have excellent EMI shielding performance to thereby be stably operated.

While exemplary embodiments have been shown and described above, it will be apparent to those skilled in the art that modifications and variations could be made without departing from the scope of the present invention as defined by the appended claims.

What is claimed is:
1. A coil component comprising:
 a body;
 a coil part including a coil pattern and embedded in the body;
 an external electrode disposed on an external surface of the body and electrically connected to the coil part;
 a shielding layer, having opposing surfaces across a thickness thereof, disposed on the external surface of the body; and
 a ceramic insulating layer disposed on the opposing surfaces of the shielding layer and covering at least a portion of a side surface of the external electrode.
2. The coil component of claim 1, wherein the ceramic insulating layer is disposed between the shielding layer and the body.
3. The coil component of claim 1, wherein the ceramic insulating layer is disposed on a surface of the shielding layer opposite to the body.
4. The coil component of claim 1, wherein the ceramic insulating layer covers an entire surface of the shielding layer.
5. The coil component of claim 4, wherein a region of the ceramic insulating layer disposed between the shielding layer and the body and a region of the ceramic insulating layer disposed on a surface of the shielding layer opposite to the body are formed integrally with each other.
6. The coil component of claim 1, wherein the shielding layer contains a metal ingredient, and the ceramic insulating layer contains an oxide of the metal ingredient.
7. The coil component of claim 6, wherein the ceramic insulating layer is an anodized layer of the metal ingredient of the shielding layer.
8. The coil component of claim 1, wherein the ceramic insulating layer contains an oxide of a metal that is not an ingredient of the shielding layer.
9. The coil component of claim 1, further comprising an adhesive layer disposed between the body and the shielding layer.
10. The coil component of claim 9, wherein the adhesive layer is in direct contact with the ceramic insulating layer.
11. The coil component of claim 9, wherein the adhesive layer is in direct contact with the shielding layer.
12. The coil component of claim 1, wherein the body has a first surface and a second surface opposing each other in one direction, the coil pattern forms at least one turn centered on the direction, and
 the external electrode is disposed at least on the first surface of the body, and the shielding layer is disposed at least on the second surface of the body.
13. The coil component of claim 12, wherein the shielding layer includes a cap portion disposed on the second surface of the body and side wall portions connected to the cap portion and disposed on wall surfaces of the body connecting the first and second surfaces of the body to each other.
14. The coil component of claim 13, wherein the wall surfaces of the body are comprised of four surfaces, and the side wall portions of the shielding layer entirely cover the four surfaces of the body.
15. The coil component of claim 13, wherein the wall surfaces of the body are comprised of four surfaces, and the side wall portions of the shielding layer cover two surfaces of the body opposing each other among the four surfaces of the body.
16. The coil component of claim 13, wherein the cap portion and the side wall portions are formed integrally with each other.
17. The coil component of claim 12, wherein the shielding layer covers only the second surface of the body.
18. The coil component of claim 1, wherein the ceramic insulating layer is in direct contact with the body. body.

* * * * *